(12) United States Patent
Saenger

(10) Patent No.: US 8,891,060 B2
(45) Date of Patent: Nov. 18, 2014

(54) OPTICAL SYSTEM, IN PARTICULAR OF A MICROLITHOGRAPHIC PROJECTION EXPOSURE APPARATUS

(71) Applicant: Carl Zeiss SMT GmbH, Oberkochen (DE)

(72) Inventor: Ingo Saenger, Heidenheim (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 13/860,755

(22) Filed: Apr. 11, 2013

(65) Prior Publication Data

US 2013/0271741 A1    Oct. 17, 2013

Related U.S. Application Data

(60) Provisional application No. 61/624,444, filed on Apr. 16, 2012.

(30) Foreign Application Priority Data

Apr. 16, 2012    (DE) .......................... 10 2012 206 150

(51) Int. Cl.
*G03B 27/42*    (2006.01)
(Continued)

(52) U.S. Cl.
CPC .......... *G03F 7/70191* (2013.01); *G02B 27/281* (2013.01); *G03F 7/20* (2013.01);
(Continued)

(58) Field of Classification Search
CPC ........ G02B 27/28; G02B 5/30; G02B 5/3083; G02B 5/3025; G02B 1/08; G02B 27/26; G02B 27/286; G03F 7/70191; G03F 7/20; G03F 7/70058; G03F 7/7015; G03F 7/70883; G02F 1/133528; G02F 1/13363; G02F 2001/133545; G02F 1/0136; G02F 2413/02
USPC ................ 355/53, 67, 71; 359/246, 627, 485, 359/490.01, 489.07
See application file for complete search history.

(56) References Cited

U.S. PATENT DOCUMENTS

| 8,023,104 | B2 | 9/2011 | Schuster |
| 8,098,366 | B2 | 1/2012 | Saenger et al. |

(Continued)

FOREIGN PATENT DOCUMENTS

| DE | 10 2007 059 258 | 7/2008 |
| DE | 102007059258 | 7/2008 |

(Continued)

OTHER PUBLICATIONS

German Office Action, with English translation, issued in DE 10 2012 206 150.9 on Nov. 30, 2012.

(Continued)

*Primary Examiner* — Mesfin T Asfaw
(74) *Attorney, Agent, or Firm* — Fish & Richardson P.C.

(57) ABSTRACT

The invention relates to an optical system, in particular of a microlithographic projection exposure apparatus, with a polarization-influencing optical arrangement. In accordance with one aspect of the invention, this polarization-influencing optical arrangement comprises: at least one polarization-influencing optical element, which consists of an optically active material with an optical crystal axis and has a thickness profile that varies in the direction of this optical crystal axis, at least one lambda/2 plate; at least one rotator, which causes a rotation of the polarization direction of light incident on the rotator about a constant polarization rotation angle, and an actuator apparatus, by which the lambda/2 plate and the rotator can be moved independently of one another between a position within the optical beam path and a position outside of the optical beam path.

20 Claims, 11 Drawing Sheets

(51) Int. Cl.
  *G02B 27/28* (2006.01)
  *G03F 7/20* (2006.01)
  *G02B 5/30* (2006.01)

(52) U.S. Cl.
  CPC  *G02B 27/28* (2013.01); *G02B 5/30* (2013.01); *G02B 5/3083* (2013.01)
  USPC ............ 355/53; 355/63; 355/67; 359/490.01; 359/489.07

(56) References Cited

U.S. PATENT DOCUMENTS

| | | | |
|---|---|---|---|
| 8,339,578 | B2 | 12/2012 | Omura |
| 2006/0055834 | A1* | 3/2006 | Tanitsu et al. .................... 349/5 |
| 2006/0055909 | A1 | 3/2006 | Fiolka et al. |
| 2006/0291057 | A1* | 12/2006 | Fiolka et al. ................. 359/489 |
| 2007/0296941 | A1* | 12/2007 | Omura ............................ 355/67 |
| 2011/0188019 | A1 | 8/2011 | Fiolka et al. |
| 2013/0050673 | A1 | 2/2013 | Saenger et al. |

FOREIGN PATENT DOCUMENTS

| | | |
|---|---|---|
| DE | 102009055184 | 6/2011 |
| DE | 102010029905 | 12/2011 |
| JP | 2003-532281 A | 10/2003 |
| JP | 2007-527549 A | 9/2007 |
| WO | WO 01/81977 A2 | 11/2001 |
| WO | 03/077011 | 9/2003 |
| WO | 2005/026843 | 3/2005 |
| WO | 2005/069081 | 7/2005 |
| WO | WO 2005/071718 A | 8/2005 |
| WO | WO 2011/154227 | 12/2011 |

OTHER PUBLICATIONS

Decision to Grant, with translation, for DE Appl No. 10 2012 206 150.9, dated May 7, 2013.
Japanese Office Action, with translation thereof, for corresponding JP Appl No. 2013-097929, dated Sep. 3, 2013.
Japanese Office Action, with translation thereof, for corresponding JP 2013-097929, dated Jan. 27, 2014.

* cited by examiner

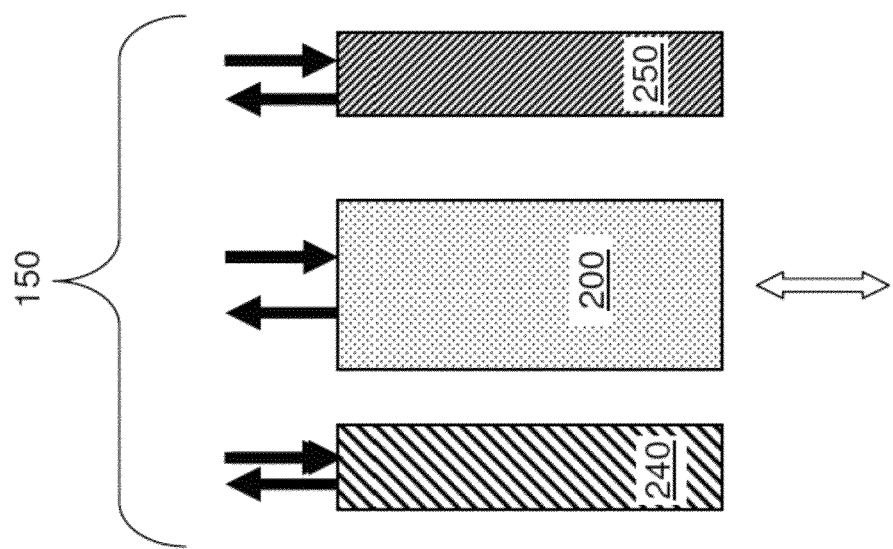
Fig. 2
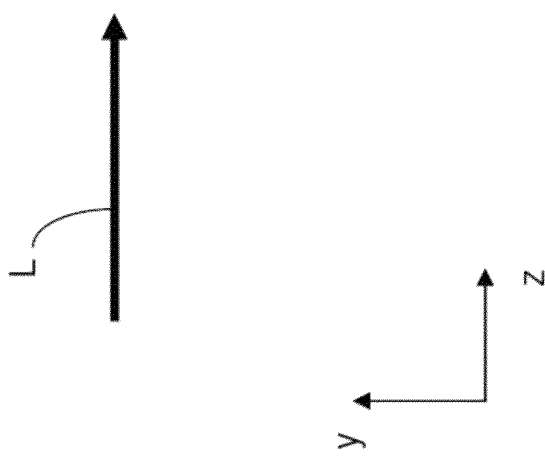

a)

b)

c)

a)

b)

OPTICAL SYSTEM, IN PARTICULAR OF A MICROLITHOGRAPHIC PROJECTION EXPOSURE APPARATUS

The present application claims benefit under 35 USC §119 of German Patent Application Serial No. 10 2012 206 150.9, filed Apr. 16, 2012. The present application also claims priority under 35 USC §119(e) to U.S. Provisional Patent Application Ser. No. 61/624,444, filed Apr. 16, 2012. The contents of each of German Patent Application Serial No. 10 2012 206 150.9 and U.S. Provisional Patent Application Ser. No. 61/624,444 are hereby incorporated by reference.

BACKGROUND OF THE INVENTION

1. Field of the Invention

The invention relates to an optical system, in particular of a microlithographic projection exposure apparatus. In particular, the invention relates to an optical system with a polarization-influencing optical arrangement, which is suitable for use in an illumination device or in a projection lens of a microlithographic projection exposure apparatus and which renders possible flexible setting of different polarization distributions, including a mixed tangential/radial polarization distribution.

2. Prior Art

Microlithography is used for producing microstructured components, such as, for example, integrated circuits or LCDs. The microlithography process is carried out in a so-called projection exposure apparatus comprising an illumination device and a projection lens. In this case, the image of a mask (=reticle) illuminated via the illumination device is projected, via the projection lens, onto a substrate (e.g. a silicon wafer) coated with a light-sensitive layer (photoresist) and arranged in the image plane of the projection lens, in order to transfer the mask structure to the light-sensitive coating of the substrate.

It is established practice to set a tangential polarization distribution in particular in both the illumination device and in the projection lens for the purposes of high-contrast imaging. A "tangential polarization" (or "TE polarization") is understood to mean a polarization distribution in which the oscillation planes of the electric field strength vectors of the individual linearly polarized light rays are oriented approximately perpendicular to the radius directed at the optical system axis. By contrast, a "radial polarization" (or "TM polarization") is understood to mean a polarization distribution in which the oscillation planes of the electric field strength vectors of the individual linearly polarized light rays are oriented approximately radially to the optical system axis. Accordingly, a quasi-tangential or a quasi-radial polarization distribution is understood to mean a polarization distribution in which the aforementioned criteria are at least approximately satisfied.

Moreover, there is also a need for setting further polarization distributions which vary over the pupil of the illumination device.

In respect of the prior art, reference is made in a purely exemplary fashion to WO 2005/069081 A2, US 2006/0055909 A1, WO 03/077011 A1 and DE 10 2009 055 184 B4.

SUMMARY OF THE INVENTION

It is an object of the present invention to provide an optical system, in particular of a microlithographic projection exposure apparatus, which renders possible flexible setting of different polarization distributions, including a mixed tangential/radial polarization distribution.

An optical system, in particular of a microlithographic projection exposure apparatus, comprises a polarization-influencing optical arrangement, wherein this polarization-influencing optical arrangement comprises:
- at least one polarization-influencing optical element, which consists of an optically active material with an optical crystal axis and has a thickness profile that varies in the direction of this optical crystal axis;
- at least one lambda/2 plate;
- at least one rotator, which causes a rotation of the polarization direction of light incident on the rotator about a constant polarization rotation angle; and
- an actuator apparatus, by which the lambda/2 plate and the rotator can be moved independently of one another between a position within the optical beam path and a position outside of the optical beam path.

The present invention is particularly based on the concept of flexibly being able to select or switch between different output polarization distributions using a polarization-influencing arrangement of a polarization-influencing optical element, which varies in its thickness and is made of optically active material, a rotator and a lambda/2 plate by selective introduction of lambda/2 plate and/or rotator into the optical beam path, wherein, in particular, it is possible to generate a mixed tangential/radial polarization distribution.

Here and in the following text, such a "mixed tangential/radial polarization distribution" (which can also be referred to as TE/TM polarization distribution or TM/TE polarization distribution) should be understood to mean a polarization distribution which has a (continuous or step-by-step) transition between a tangential and a radial polarization distribution. In other words, such a polarization distribution, in the transition between points in the pupil at which the oscillation planes of the electric field strength vectors of the individual linearly polarized light rays are oriented approximately perpendicular to the radius directed at the optical system axis and points at which the oscillation planes of the electric field strength vectors of the individual linearly polarized light rays are oriented approximately parallel to the radius directed at the optical system axis, has points at which the oscillation planes of the electric field strength vectors lie between these two "extreme" positions and continuously or step-by-step transition from the tangential to the radial alignment over the pupil.

By virtue of the fact that the additional components to the polarization-influencing optical element present in the polarization-influencing optical arrangement according to the invention, namely the lambda/2 plate and rotator, are configured in such a way that they can, selectively and independently of one another, be introduced into the optical beam path or removed from the optical beam path, it is possible, depending on the combination of these components situated in the beam path, to switch between different output polarization distributions in a flexible manner. Here, the actuator apparatus can have individual actuators which are associated with the respective aforementioned components of the polarization-influencing optical arrangement.

Within the scope of the present invention, the above-described "mixed tangential/radial polarization distribution" in particular is obtained by combining the effect of a polarization-influencing optical element, which is made of optically active material with varying thickness profile and is known, as such, from WO 2005/069081 A2, with the "breaking of symmetry" obtained by a lambda/2 plate. This is because while the polarization-influencing optical element—as will be explained in more detail below—can for example initially generate a tangential or quasi-tangential polarization distribution, it is possible, as a result of the lambda/2 plate in the polarization-influencing optical arrangement, to modify further the ultimately obtained output polarization distribution by virtue of the tangential or quasi-tangential polarization distribution being converted into a mixed tangential/radial polarization distribution. Here, the polarization-influencing effect of the lambda/2 plate corresponds to a mirroring of the preferred polarization direction of the light incident on the optical crystal axis of the lambda/2 plate. Moreover, this polarization-influencing effect can be flexibly modified further in the case of a rotational embodiment (explained in more detail below) of the lambda/2 plate (with rotatability about the optical system axis or about an axis parallel to the light-propagation direction).

The switch according to the invention to different polarization distributions, including the aforementioned mixed tangential/radial polarization distribution, can, in this case, in particular be implemented without requiring a rotation of the polarization-influencing optical element or an interchange of the latter and can therefore also be realized in the case of typically restricted available installation space (which may, for example, not suffice for an interchange or rotation apparatus for the of the polarization-influencing optical element).

The rotator furthermore provided in the polarization-influencing optical arrangement according to the invention, which rotator can preferably be configured as a 90° rotator, renders it possible, as required, instead of the above-described TE/TM or TM/TE output polarization distribution, to generate an output polarization distribution in which there once again is a continuous or step-by-step transition between a tangential and a radial polarization distribution, but, as a result of the rotation of the preferred polarization direction introduced by the 90° rotator, with a tangentially extending preferred polarization direction at precisely those positions where the above-described example had a radial polarization, and vice versa. Furthermore, if the lambda/2 plate is placed outside of the optical beam path, the rotator renders it possible to convert a tangential polarization distribution, for example generated by the polarization-influencing optical element, into a radial polarization distribution, or vice versa.

In embodiments of the invention, the rotator can likewise be embodied as a lambda/2 plate or comprise at least one lambda/2 plate.

In accordance with one embodiment, the actuator apparatus can furthermore be used to move the polarization-influencing optical element independently of the lambda/2 plate and the rotator between a position within the optical beam path and a position outside of the optical beam path.

In accordance with one embodiment, the optical system has an optical axis, wherein the lambda/2 plate is configured to be rotatable about this optical axis or about an axis parallel thereto in order to change the generated output polarization distribution further in a flexible fashion. This embodiment of the optical system with a rotatable lambda/2 plate is also advantageous, independently of the above-described concept of a rotator present in the polarization-influencing optical arrangement.

In accordance with a further aspect, the invention therefore also relates to an optical system, in particular of a microlithographic projection exposure apparatus, with an optical axis and a polarization-influencing optical arrangement, wherein this polarization-influencing optical arrangement comprises:
at least one polarization-influencing optical element, which consists of an optically active material with an optical crystal axis and has a thickness profile that varies in the direction of this optical crystal axis; and
at least one lambda/2 plate;
wherein the lambda/2 plate is configured to be rotatable about the optical axis or about an axis parallel thereto.

In accordance with one embodiment, the optical system furthermore comprises an actuator apparatus, by which the lambda/2 plate and the polarization-influencing optical element can be moved independently of one another between a position within the optical beam path and a position outside of the optical beam path In accordance with one embodiment, the lambda/2 plate has at least one first sub-element of optically positive uniaxial crystal material and at least one second sub-element of optically negative uniaxial crystal material. This embodiment of the lambda/2 plate (which, as such, is known from DE 10 2007 059 258 A1) in particular renders it possible to undertake an angle of incidence-independent polarization-influencing effect of the lambda/2 plate in a plane of a microlithographic projection exposure apparatus, in which the light rays are not all parallel to one another but rather have an angular distribution. In particular, an angle of incidence-independent setting of the polarization can take place in a plane, which either does not correspond to a pupil plane or else represents a pupil plane, which, in the light-propagation direction, is arranged downstream of a field-generating optical element and hence is passed through by light at different angles.

In this case, both here and in the following text, an optically positive uniaxial crystal material (also: birefringent material with an optically positive nature) is, in accordance with conventional terminology, understood to mean an optically uniaxial crystal material for which the extraordinary refractive index $n_e$ is greater than the ordinary refractive index $n_o$. Accordingly, an optically negative uniaxial crystal material (also: birefringent material with an optically negative nature) is understood to mean an optically uniaxial crystal material for which the extraordinary refractive index $n_e$ is less than the ordinary refractive index $n_o$. By way of example, suitable optically positive materials are crystalline quartz ($SiO_2$) and magnesium fluoride ($MgF_2$). By way of example, suitable optically negative materials are sapphire ($Al_2O_3$) and lanthanum fluoride ($LaF_3$). In respect of exemplary quantitative specifications in respect of the thicknesses of the sub-elements suitable for generating an effect corresponding to a lambda/2 plate, reference is made to DE 10 2007 059 258 A1 (cf., therein, Tables 1ff).

The arrangement of the lambda/2 plate in one of the aforementioned positions (i.e. in a downstream position with respect to the first pupil plane) can be advantageous, particularly in respect of the fact that such positioning can achieve an effect of retardation compensation, which goes beyond the initially sought-after effect according to the invention of flexible polarization setting: since an undesired polarization ellipticity, which is present in the optical system and which, in respect of the light-propagation direction of the lambda/2 plate, was generated or collected in the anteceding ("first") part of the illumination device, is reversed by the effect of the lambda/2 plate (i.e. changed from right-circular elliptical to left-circular elliptical or vice versa), it is possible to obtain an at least partial compensation of an undesired system retardation as a result of the polarization ellipticity generated or collected in the, in respect of the light-propagation direction, subsequent ("second") part of the illumination device in relation to the lambda/2 plate. In principle, this compensation can also be brought about by the above-described 90° rotator (which can likewise be embodied as a lambda/2 plate) as a component of the polarization-influencing optical arrangement.

In accordance with this aspect, the lambda/2 plate, utilized according to the invention, in this respect assumes a dual function inasmuch as it firstly serves or contributes to the targeted generation of a desired polarization distribution and secondly also brings about an at least partial compensation of an undesired system retardation.

The invention furthermore relates to a microlithographic projection exposure apparatus and a method for microlithographic production of microstructured components.

Further embodiments of the invention can be gathered from the description and the dependent claims.

The invention will be explained in more detail below on the basis of exemplary embodiments illustrated in the attached figures.

BRIEF DESCRIPTION OF THE DRAWINGS

In detail:

FIG. 2 shows a schematic illustration for explaining the design of a polarization-influencing optical arrangement in accordance with an embodiment of the invention;

DETAILED DESCRIPTION OF PREFERRED EMBODIMENTS

Figure 1:
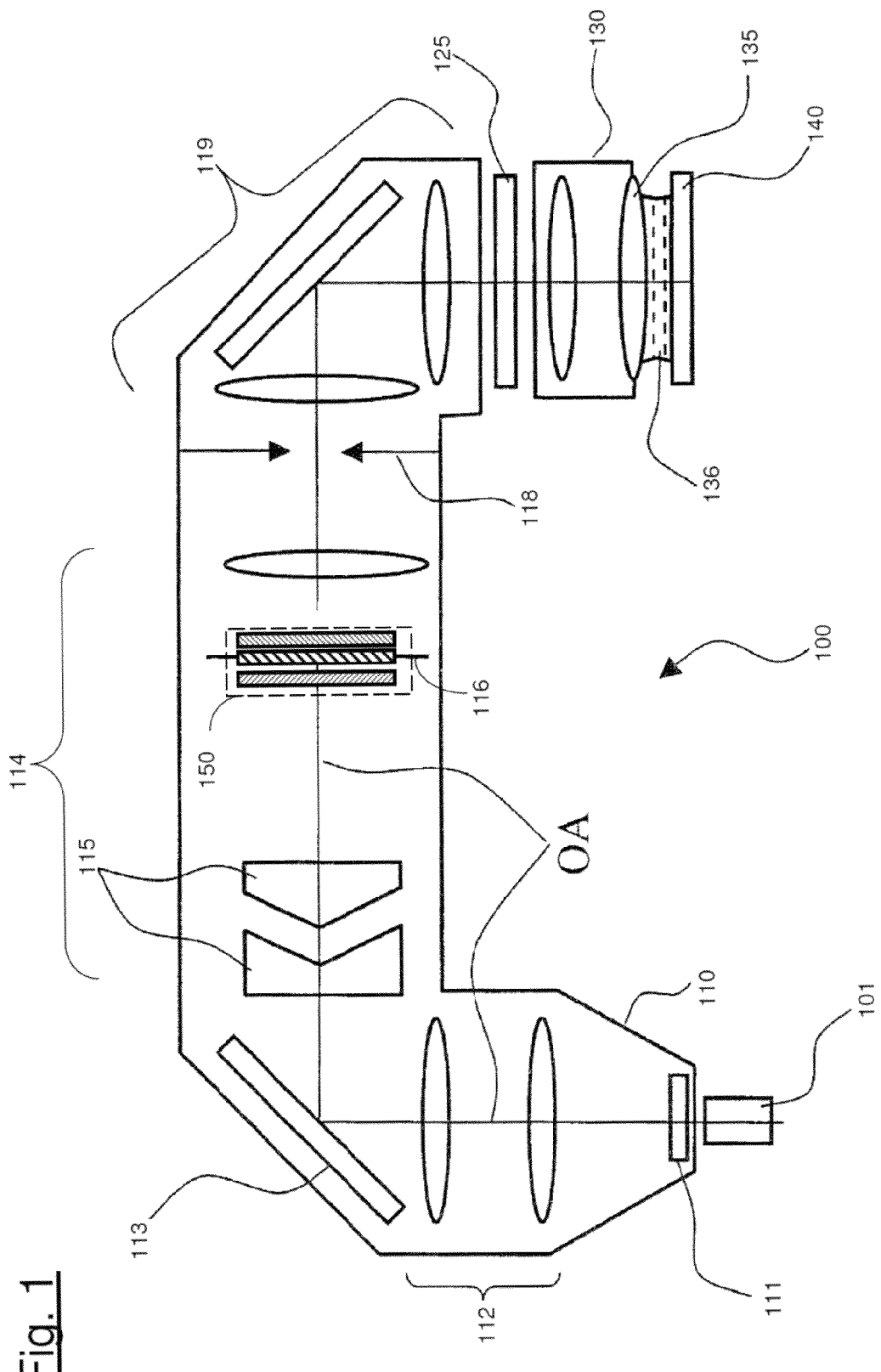
FIG. 1 shows a schematic illustration for explaining the design of a microlithographic projection exposure apparatus with a polarization-influencing optical arrangement in accordance with an embodiment of the invention.

FIG. 1 shows a schematic illustration of a microlithographic projection exposure apparatus 100 with a light-source unit 101, an illumination device 110, a mask 125 having structures to be imaged, a projection lens 130 and a substrate 140 to be exposed. As a light source, the light-source unit 101 comprises a DUV- or VUV laser, for example an ArF laser for 193 nm, an $F_2$ laser for 157 nm, an $Ar_2$ laser for 126 nm or an $Ne_2$ laser for 109 nm, and a beam shaping optical unit, which generates a parallel light beam. The rays in the light beam have a linear polarization distribution, wherein the oscillation planes of the electric field vector of the individual light rays extend in a uniform direction.

The parallel light beam is incident on a divergence-increasing optical element 111. By way of example, a grid plate made of diffractive or refractive grid elements can be used as divergence-increasing optical element 111. Each grid element generates a pencil of rays, the angular distribution of which is determined by the extent and focal length of the grid element. The grid plate is situated in the object plane of a subsequent lens 112, or in the vicinity thereof. The lens 112 is a zoom lens, which generates a parallel light beam with a variable diameter. The parallel light beam is directed at an optical unit 114 comprising an axicon 115 via a deflection mirror 113. Using the zoom lens 112 in conjunction with the axicon 115, different illumination configurations are generated in a pupil plane 116, depending on zoom setting and position of the axicon elements.

In further embodiments, the illumination device for generating different illumination configurations can also (in place of the divergence increasing optical element 111 and the zoom lens 112 in conjunction with the axicon 115) have a mirror arrangement, which comprises a multiplicity of mirror elements, which can be adjusted independently of one another, and as is known from e.g. WO 2005/026843 A2. These mirror elements can in each case be tilted individually, for example in an angular range from −2° to +2°, in particular −5° to +5°, even more particularly −10° to +10°. By using a suitable tilt arrangement of the mirror elements in the mirror arrangement, it is likewise possible to form a desired light distribution, e.g. an annular illumination setting or else a dipole setting or quadrupole setting, in the pupil plane 116 by virtue of the previously homogenized and collimated laser light in each case being deflected into the corresponding direction by the mirror elements, depending on the desired illumination setting.

In the pupil plane 116, or in the direct vicinity thereof, there is a polarization-influencing optical arrangement 150, as will be explained in more detail in the following text with reference to FIG. 2 and following.

The optical unit 114 is followed by a reticle masking system (REMA) 118, which is imaged on the structure-carrying mask (reticle) 125 via a REMA lens 119 and, as a result, delimits the illuminated region on the reticle 125. The structure-carrying mask 125 is imaged on the light-sensitive substrate 140 via the projection lens 130. An immersion liquid 136 with a refractive index that differs from air may be situated between a last optical element 135 of the projection lens 130 and the light-sensitive substrate 140.

In accordance with FIG. 2, the polarization-influencing optical arrangement 150 has, in succession in the light-propagation direction (denoted by the arrow "L"), a rotator 240, a polarization-influencing optical element 200, described in more detail below with reference to FIGS. 3a-d, and a lambda/2 plate 250. Here, the rotator 240 itself can also be embodied as a (further) lambda/2 plate or can comprise at least one lambda/2 plate. Moreover, the lambda/2 plate 250, just like the rotator 240, which is optionally embodied as a lambda/2 plate, too, can also (as will be explained in more detail below with reference to FIG. 8) be embodied to be rotatable about a rotation axis, with this rotation axis extending along the optical system axis or parallel thereto.

The polarization-influencing optical element 200 is made of an optically active material, in particular quartz, and has a thickness profile that varies in the direction of the optical crystal axis. The general mode of operation of optically active crystals and polarization-influencing optical elements made of such crystals is illustrated in FIG. 3d. Optically active crystals have at least one optical crystal axis CA, which is specified by the crystal structure. If linearly polarized light propagates along this optical crystal axis CA, the oscillation plane of the electric field vector 281 is rotated by a rotation angle β, which is proportional to the distance d traveled through the crystal 280. The corresponding proportionality factor is the specific optical rotation α and constitutes a material-specific variable which is dependent on the wavelength radiated thereon. By way of example, at a wavelength of 180 nm, the specific optical rotation of quartz was determined to be (325.2±0.5)°/mm.

Figure 3A:
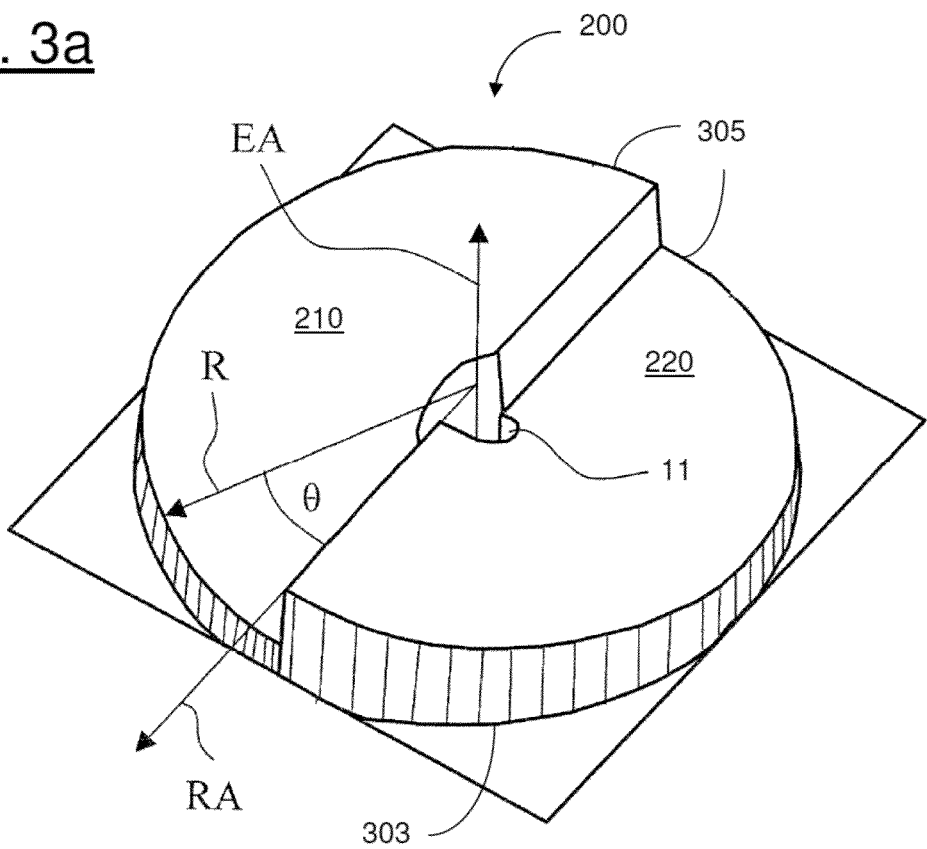
FIGS. 3a-d show schematic illustrations for explaining exemplary embodiments of a polarization-influencing optical element provided in the polarization-influencing optical arrangement according to the invention.

FIG. 3a shows a specific exemplary embodiment of such a polarization-influencing optical element 200. In the exemplary embodiment, the thickness profile of the polarization-influencing optical element 200 is such that the element 200 converts a linear polarization distribution with a constant preferred polarization direction over the light-beam cross section of a light beam passing through the element 200 into a tangential polarization distribution. In the exemplary embodiment, the polarization-influencing optical element 200 has a cylindrical shape with a base area 303 embodied as circular planar surface and an area 305 situated opposite thereto and also, for manufacturing reasons, a central bore 11 and the element is composed of sub-elements 210, 220.

In the exemplary embodiment, the polarization-influencing optical element 200 has a constant thickness along a radius R, which is perpendicular to the element axis EA and forms an angle θ with a reference axis RA, which intersects the element axis and serves as reference axis for the azimuth angle θ. The thickness profile illustrated in FIG. 3b therefore is only dependent on the azimuth angle θ. In the exemplary embodiment in FIG. 3a, b, an azimuth cut d(r=const, θ) through the thickness profile d(r, θ) is a linear function of the azimuth angle θ for an azimuth angle 10°<θ<170° (more particularly 0°<θ<180°) and for an azimuth angle 190°<θ<350° (more particularly 180°<θ<360°) and for a constant distance r from the element axis, wherein this linear function at least approximately has a gradient $$|m| = \frac{180°}{\alpha \pi r},$$

wherein α is the specific optical rotation of the optically active crystal.

In respect of the embodiment of the polarization-influencing optical element 200, the invention is not restricted to the thickness profile which is illustrated in FIG. 3a and varies continuously as a function of azimuth angle in the sub-elements 210, 220. In accordance with a further exemplary embodiment, illustrated in a top view in FIG. 3c, the segments of the polarization-influencing optical element 230 can also have a step-like profile or be composed of individual, respectively plane-parallel circular arc-shaped elements 231. Here, it is also possible to obtain a quasi-tangential polarization distribution by designing the polarization-influencing optical element using only two mutually opposing, respectively plane-parallel plates which respectively bring about a polarization rotation angle of 90°.

The invention now renders it possible, by combining the above-described polarization-influencing optical element 200, which varies in its thickness and is of optically active material, with a lambda/2 plate 250 and a (preferably 90°) rotator 240 to set different polarization distributions in a flexible manner by virtue of the fact that the lambda/2 plate 250 and/or the rotator 240 can be selectively introduced into the optical beam path or removed therefrom, as will be described in the following text with reference to FIG. 2ff.

For the purposes of selectively placing the lambda/2 plate 250 and the rotator 240 in the optical beam path, the polarization-influencing optical arrangement 150 has a suitable actuator, which can, for example, be embodied as a retractor, for moving the lambda/2 plate 250 and the rotator 240 independently of one another in a common advance direction (along the y-direction of the plotted coordinate system in the shown exemplary embodiment) and in this way positioning these selectively in the optical beam path. The movability of the components 240, 250 and of the element 200 as well is symbolized in FIG. 2 by the plotted double-headed arrows.

Referring once again to FIG. 2, the rotator 240 first of all causes a rotation, about a constant polarization rotation angle, of the polarization direction of light incident on the rotator 240, wherein this polarization rotation angle is 90° in the exemplary embodiment, by virtue of the oscillation plane of the electric field strength vector of each individual linearly polarized light ray in the beam being rotated by 90°.

In further exemplary embodiments, the rotator 240 can, in respect of the light-propagation direction, also be arranged downstream of the polarization-influencing optical element 200. One possible embodiment of the rotator 240 consists of providing in the beam path a plane-parallel plate of an optically active crystal, the thickness of which plane-parallel plate is approximately $90°/\alpha_P$, wherein $\alpha_P$ specifies the specific optical rotation of the optically active crystal and wherein the optical crystal axis of this plane-parallel plate extends parallel to the element axis thereof and parallel to the optical system axis. In accordance with a further exemplary embodiment, the rotator 240 can be composed of two lambda/2 plates made of a birefringent crystal. These respectively have a slow axis, which extends in the direction of a lower refractive index, and, perpendicular thereto, a fast axis, which extends in the direction of a higher refractive index. Here, the two lambda/2 plates are rotated with respect to one another in such a way that their slow axes or their fast axes respectively form an angle of 45°.

The rotator 240 can furthermore itself be embodied as a lambda/2 plate. In this case, it is likewise possible in a merely exemplary fashion—and proceeding from the arrangement in FIG. 2—for there to be a pupil-independent rotation of the polarization direction via the rotator 240 embodied as a lambda/2 plate, a conversion into a tangential polarization distribution via the polarization-influencing optical element 200 and finally a conversion into a mixed tangential/radial polarization distribution via the (further) lambda/2 plate 250.

In further embodiments, it is possible to use an interchange apparatus in order to push one of a plurality of different rotators (with polarization rotation angles that differ from one another) out of the optical beam path or into the beam path via a suitable actuator. In a merely exemplary fashion, this can be a revolver apparatus equipped with a suitable rotation mechanism and optionally an integrated motor.

Figure 4:
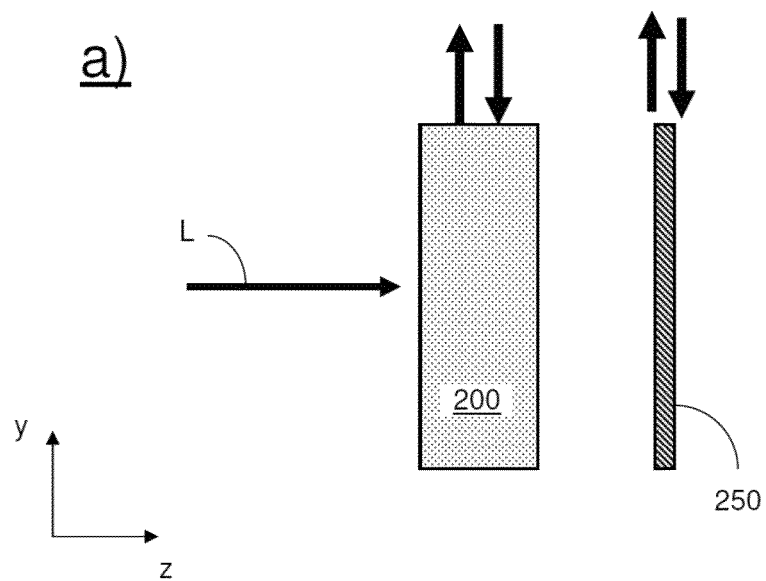
FIGS. 4a-c and 5a-d show schematic illustrations of different output polarization distributions which can be generated within the scope of the invention.
Figure 4:
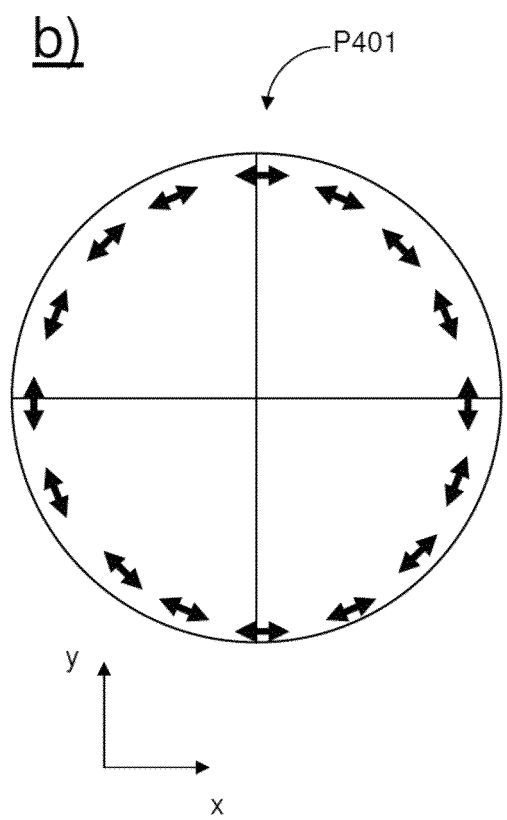
Figure 4:
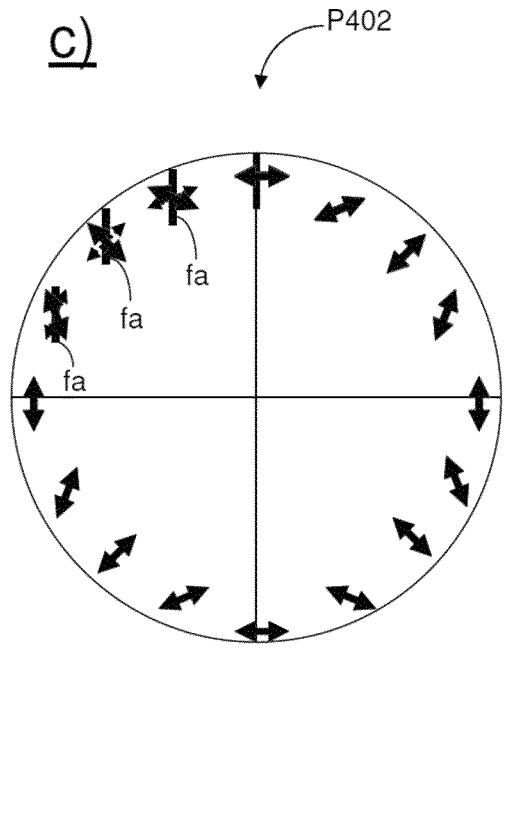
Figure 5:
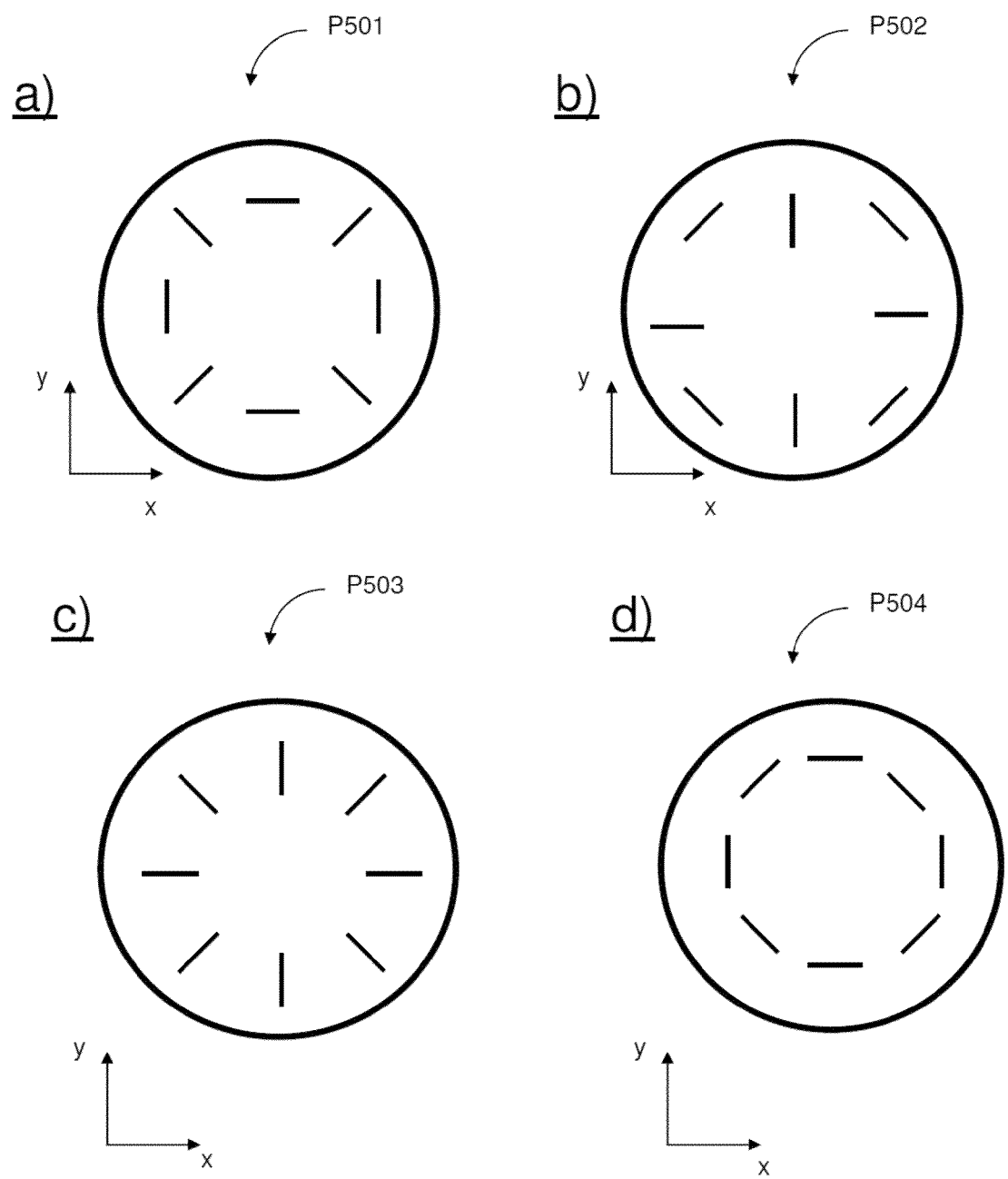

The schematic illustrations in FIGS. 4a-c serve to illustrate the output polarization distribution obtainable by the interaction of polarization-influencing optical element 200 and lambda/2 plate 250. Here, the polarization distribution P401 shown in FIG. 4b corresponds to a tangential polarization distribution, as obtained by the polarization-influencing optical element 200 in the case of a constant linear input polarization distribution.

The lambda/2 plate 250 causes a mirroring of the preferred polarization direction of the incident light on the optical crystal axis of the lambda/2 plate 250, wherein the position of this optical crystal axis is plotted in FIG. 4c and denoted by "fa" and extends in the y-direction in the plotted coordinate system. In further exemplary embodiments, the lambda/2 plate 250 can be designed to be rotatable about the optical system axis OA or an axis parallel to the light-propagation direction (denoted by the arrow "L") in order to change further the generated output polarization distribution in a flexible manner. The lambda/2 plate 250 can be made of suitable birefringent material, for example crystalline quartz with an orientation of the optical crystal axis perpendicular to the light-propagation direction or to the optical system axis (extending in the z-direction in the plotted coordinate system), in which case only a comparatively low thickness of a few micrometers (μm) is required for realizing a lambda/2 retardation.

The output polarization distribution P402 obtained from the polarization distribution P401 downstream of the lambda/2 plate 250 is illustrated in FIG. 4c and is such that the preferred polarization direction or the oscillation direction of the electric field strength vector extends tangentially in the positions described by "12 o'clock", "3 o'clock", "6 o'clock" and "9 o'clock" and extends radially in the positions rotated by 45° about the x-axis or the optical system axis OA with respect to these positions. Between these, there is a continuous transition between these "extremes" by virtue of the oscillation direction continuously transitioning over the pupil from the tangential alignment into the radial alignment. Hence, the output polarization distribution generated by the interaction of the polarization-influencing optical element 200 with the lambda/2 plate 250 has a continuous transition between a tangential and a radial polarization distribution and therefore constitutes a "mixed tangential/radial polarization distribution". This polarization distribution illustrated in FIG. 4c can also be referred to as TE/TM polarization distribution or as TM/TE polarization distribution.

The polarization-influencing optical arrangement 150 according to the invention, made up of polarization-influencing optical element 200, lambda/2 plate 250 and optionally of rotator 240, can be used for flexibly setting different polarization distributions, as will be explained with reference to FIGS. 5a-d.

What the rotator 240 can achieve in the case of combined use with the polarization-influencing optical element 200 and the lambda/2 plate 250 is that the polarization-influencing optical arrangement 150, in place of the mixed tangential/radial output polarization distribution from FIG. 4c which is also illustrated again in FIG. 5a in a schematic and simplified fashion and denoted by "P501", generates an output polarization distribution indicated in FIG. 5b, in which the preferred polarization direction or the oscillation direction of the electric field strength vector extends radially in the positions described by "12 o'clock", "3 o'clock", "6 o'clock" and "9 o'clock" and extends tangentially in the positions rotated by 45° about the x-axis or the optical system axis OA with respect to these positions. This output polarization distribution P502 likewise has a continuous transition between a tangential polarization distribution and a radial polarization distribution and likewise constitutes a mixed tangential/radial polarization distribution.

Furthermore, the polarization-influencing optical arrangement 150 can also generate a tangential (if both the rotator 240 and the lambda/2 plate 250 are placed outside of the optical beam path) or a quasi-tangential output polarization distribution (depending on the embodiment of the polarization-influencing optical element 200) in accordance with FIG. 5d or else also a radial (if the rotator 240 is placed within the optical beam path and the lambda/2 plate 250 is placed outside of the optical beam path) or quasi-radial output polarization distribution (depending on the embodiment of the polarization-influencing optical element 200) in accordance with FIG. 5d.

In summary, the polarization-influencing optical arrangement 150 shown in FIG. 2 can be used to switch in a flexible manner between different output polarization distributions by selectively introducing the individual components 240, 200 and 250 into the optical beam path, wherein, in particular, the output polarization distributions merely illustrated schematically in FIGS. 5a-d can be set, namely a radial polarization distribution P503 (FIG. 5c) and a tangential polarization distribution P504 (FIG. 5d) in addition to the previously described mixed tangential/radial polarization distributions P501 and P502 (in accordance with FIGS. 5a and 5b).

Even though the lambda/2 plate 250 is, in the arrangement described on the basis of FIG. 1, arranged in terms of its position within the optical beam path together with the remaining components of the polarization-influencing optical arrangement 150 in a first pupil plane of the illumination apparatus 110, the invention is not restricted hereto.

Rather, in further embodiments, the lambda/2 plate 250 can also be arranged in a downstream position with respect to the first pupil plane of the illumination device. Here, in particular, it is possible to achieve an effect of a retardation compensation via suitable positioning of the lambda/2 plate 250; this goes beyond the action of flexible polarization setting initially sought after according to the invention and will be explained in the following text with reference to FIG. 6a-c.

Figure 6:
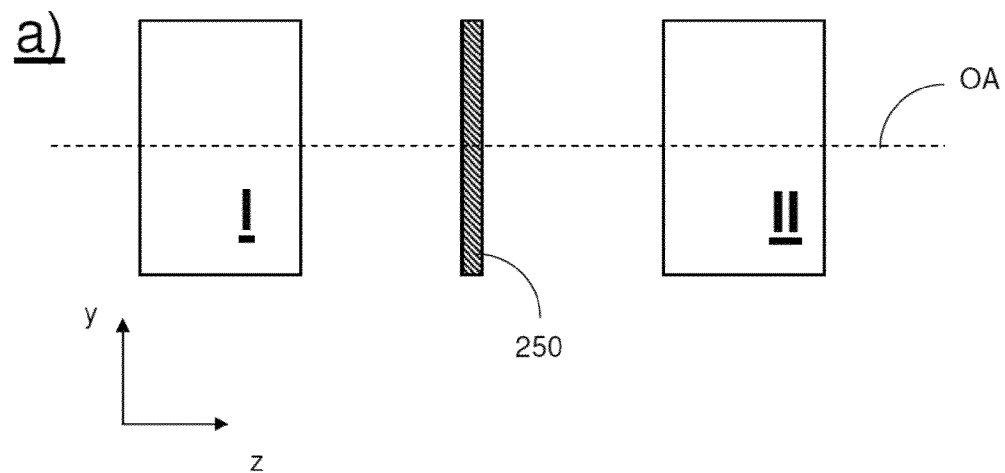
FIGS. 6a-c show schematic illustrations for explaining a further aspect of the lambda/2 plate provided in the polarization-influencing optical arrangement according to the invention.
Figure 6:
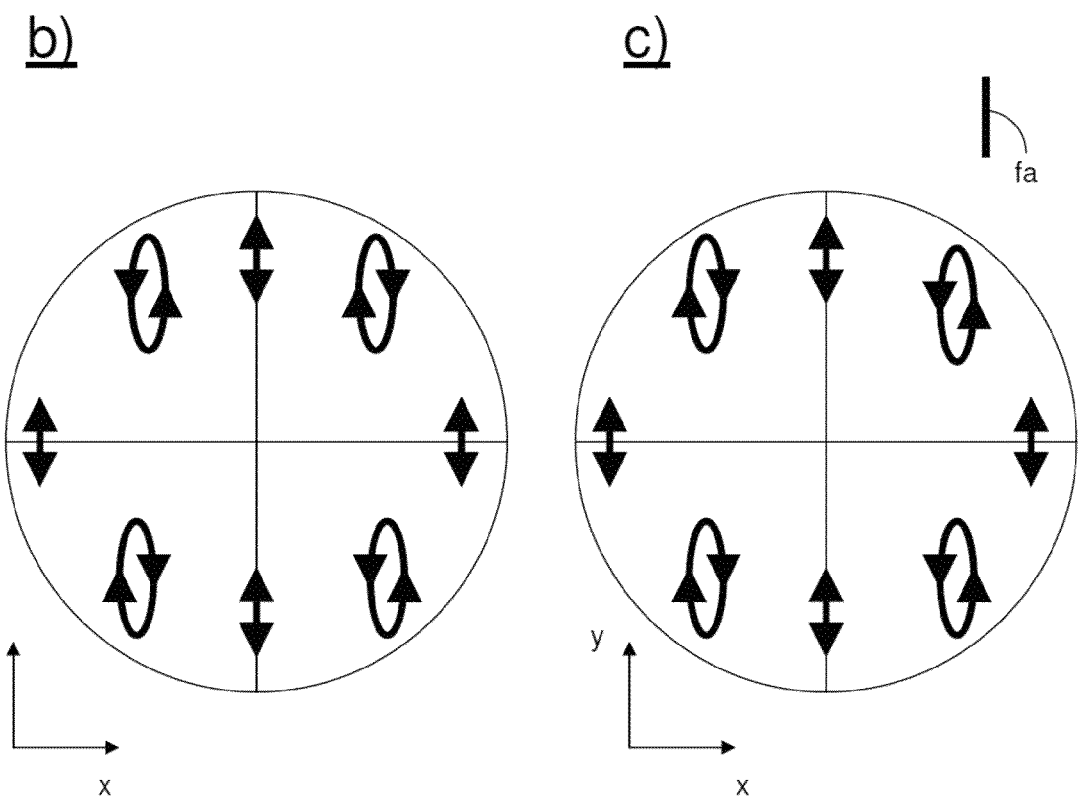

In the much simplified, schematic illustration in FIG. 6a, the block "I" symbolizes that section of the illumination device which is arranged upstream of the lambda/2 plate 250 in the light-propagation direction and the block "II" symbolizes that section of the illumination device which is arranged downstream of the lambda/2 plate 250 in the light-propagation direction. As furthermore illustrated schematically in FIG. 6b, c, the lambda/2 plate 250 causes a reversal in the polarization ellipticity, which was undesirably generated or collected in the part of the illumination device (block "I") which precedes the lambda/2 plate 250 in respect of the light-propagation direction. Here, the polarization distribution illustrated in FIG. 6b can be caused in the optical system by e.g. a radial or tangential distribution of the fast axis of the birefringence in the material of optical components such as e.g. lenses.

As a result of the reversal of the polarization ellipticity caused by the lambda/2 plate 250, an at least partial compensation of an undesired system retardation can be obtained by the polarization ellipticity generated or collected in the part of the illumination device (block "II") which follows the lambda/2 plate 250 in respect of the light-propagation direction. Here, the lambda/2 plate 250 utilized according to the invention assumes a dual function inasmuch as it firstly (as described above on the basis of FIGS. 4-5) contributes to the targeted generation of a desired polarization distribution and secondly also brings about an at least partial compensation of an undesired system retardation.

The above-described compensation principle is not restricted to the compensation of an undesired system retardation in the case of a constant linear (intended) polarization distribution, but rather can also be realized in conjunction with other, more complicated (intended) polarization distributions. Here, for the optimal realization of the above-described compensation effect it is also possible to use an arrangement of a plurality of lambda/2 plates instead of a single lambda/2 plate, depending on the specific (intended) polarization distribution generated in the optical system, wherein the alignment of the fast axis of the birefringence can vary in this arrangement of lambda/2 plates and, in particular, in each case ideally extends perpendicular or parallel to the polarization direction at each pupil point in the individual lambda/2 plates.

Furthermore, the lambda/2 plate (or the arrangement of a plurality of lambda/2 plates) utilized to realize the above-described compensation principle can, in principle, also be arranged at a position in which the light rays are not all parallel with respect to one another but rather have an angular distribution, i.e., for example, in a plane which either does not correspond to a pupil plane or else represents a pupil plane which, in the light-propagation direction, is arranged downstream of a field-generating optical element and is therefore passed through by light at different angles.

In order to realize an angle of incidence-independent setting of the polarization by the lambda/2 plate (or by the arrangement of a plurality of lambda/2 plates) in such situations as well, the lambda/2 plate (or the lambda/2 plates of the corresponding arrangement) can—in a manner known per se from DE 10 2007 059 258 A1—be designed in such a way that it has or they have a first sub-element of optically positive uniaxial crystal material and at least one second sub-element of optically negative uniaxial crystal material. By way of example, suitable optically positive materials are crystalline quartz ($SiO_2$) and magnesium fluoride ($MgF_2$). By way of example, suitable optically negative materials are sapphire ($Al_2O_3$) and lanthanum fluoride ($LaF_3$). In respect of exemplary quantitative specifications in respect of the sub-elements respectively present in one of the retardation elements, in particular in respect of the thicknesses suitable for generating an effect corresponding to a lambda/2 plate, reference is made to DE 10 2007 059 258 A1 (cf., therein, Tables 1*ff*). In principle, the lambda/2 plate (or the lambda/2 plates of the corresponding to the arrangement), utilized according to the invention in such an embodiment, can be arranged at any position in the illumination device, wherein, preferably, the angles of incidence of the light rays incident on the lambda/2 plates or the arrangement of lambda/2 plates are not greater than 40°.

FIGS. 7-10 show schematic illustrations for explaining further exemplary embodiments of the present invention. FIGS. 7*a-l* initially show, in the form a table, the respectively obtainable polarization distribution in the second column of the table (i.e. in FIGS. 7*b, d, f, h, j* and *l*), respectively next to a schematic illustration of the respective positioning of the components 240, 200 and 250, contained in the polarization-influencing optical arrangement 150 according to the invention in the design from FIG. 2, within or outside of the optical beam path, contained in the first column of the table (i.e. in FIGS. 7*a, c, e, g, i* and *k*). Here, the light respectively incident on the arrangement 150, as can be seen from FIGS. 7*a-b*, is polarized in the y-direction and the lambda/2 plate 250 is arranged in such a way that the fast axis of the birefringence is oriented either in the x-direction or in the y-direction.

Figure 3B:
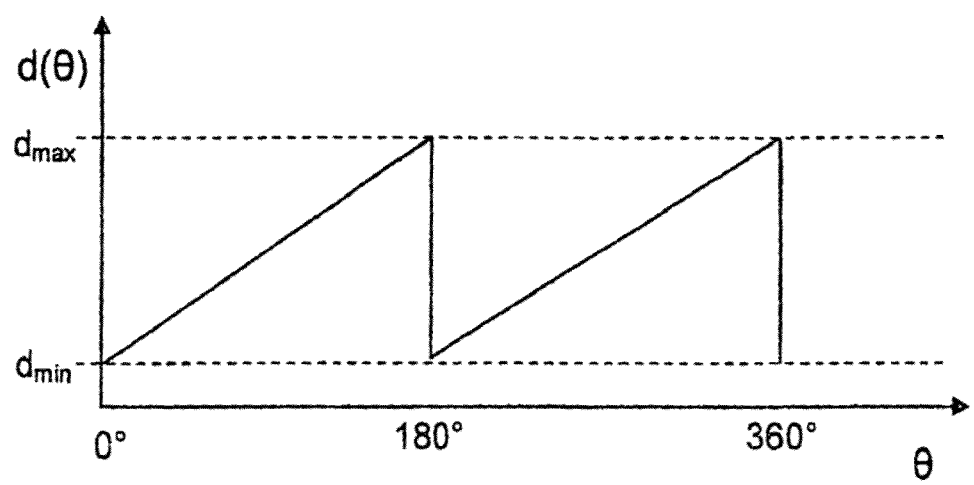
Figure 3C:
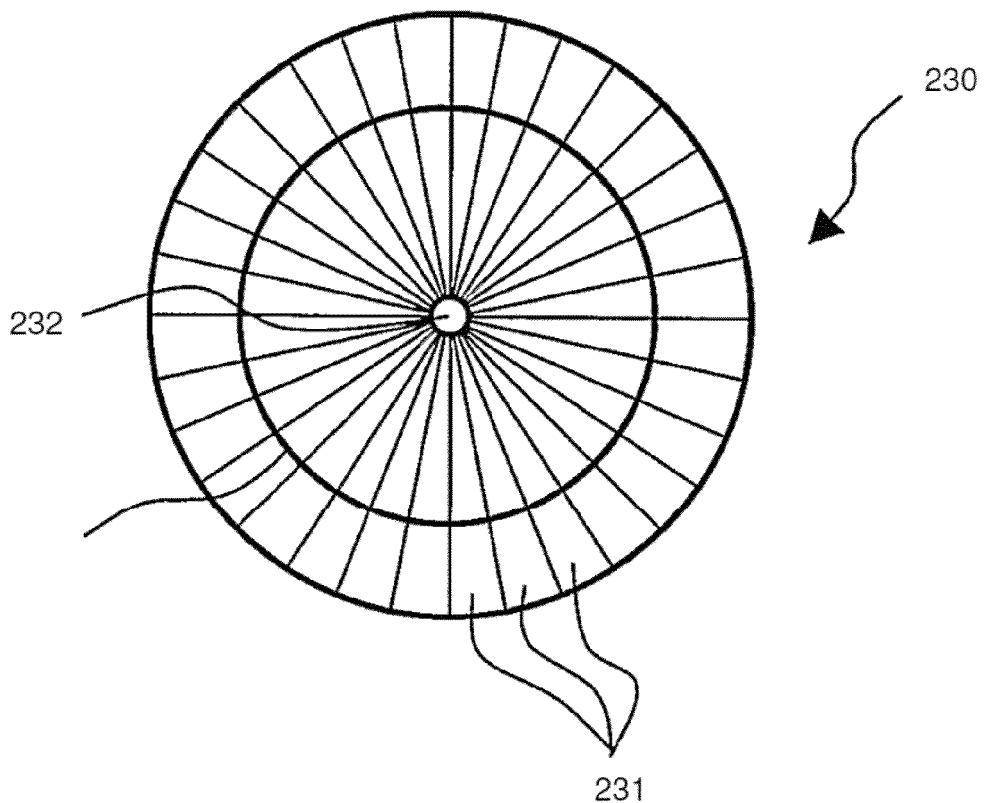
Figure 3D:
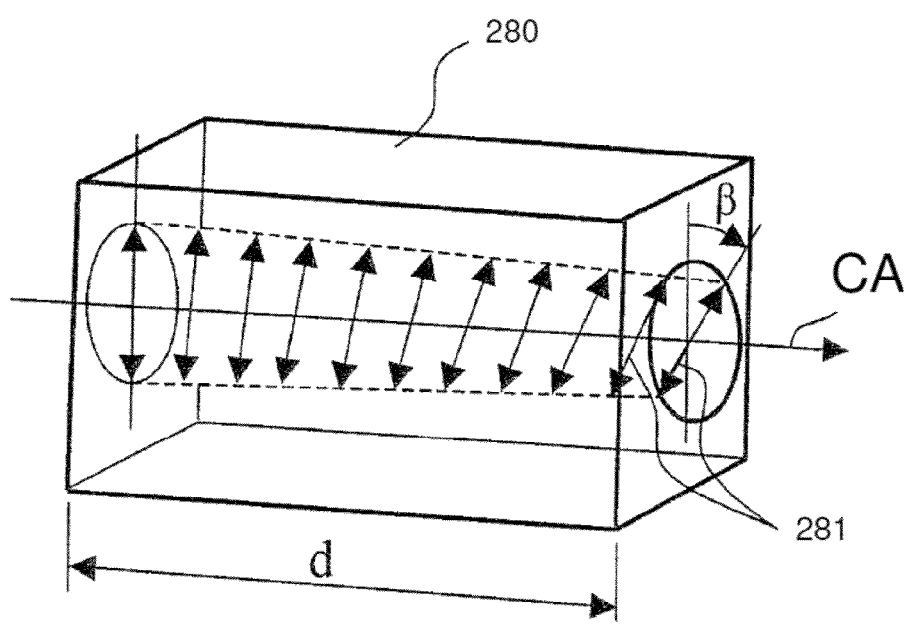
Figure 7:
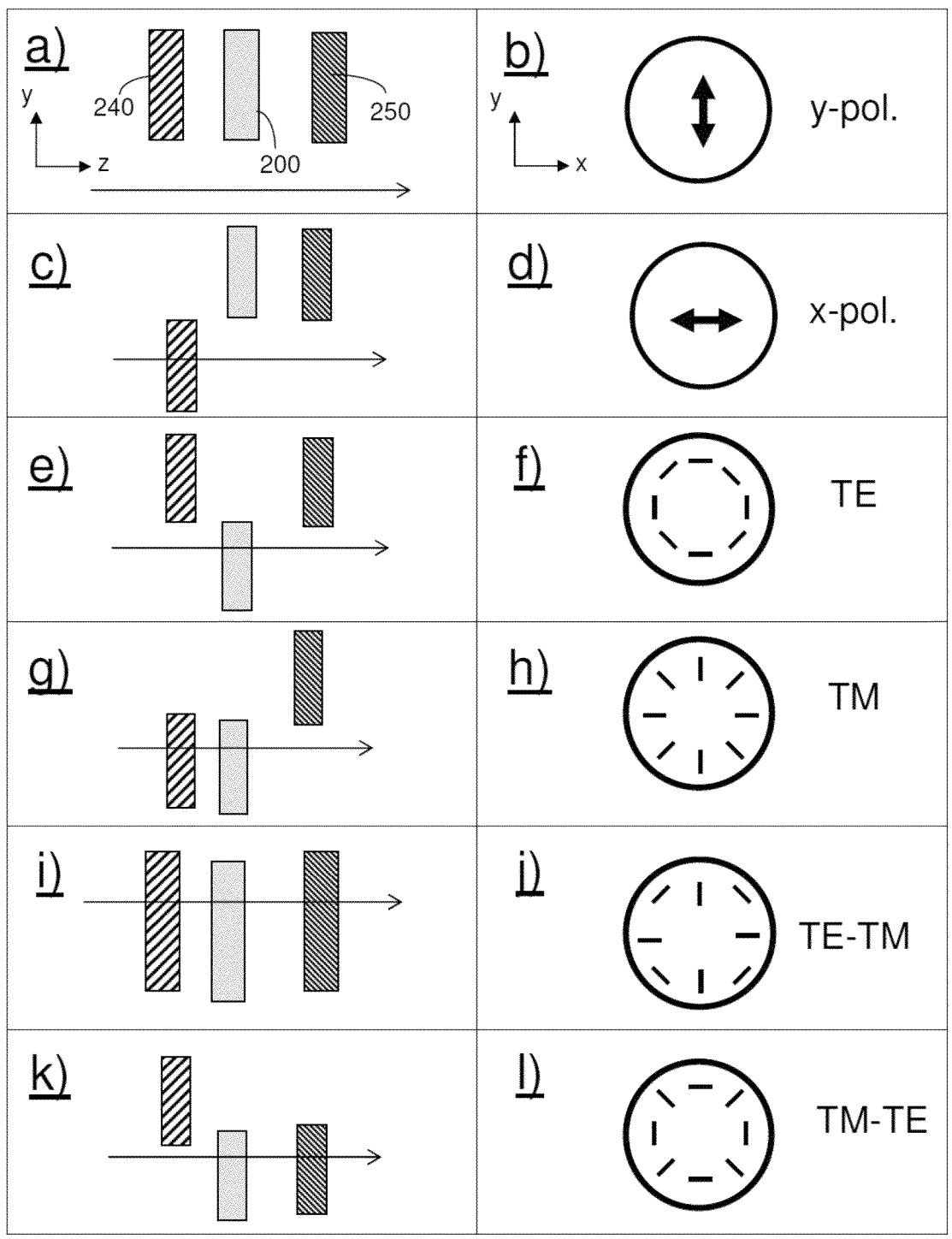
FIGS. 7a-l, 8a-c, 9a-l and 10a-b show schematic illustrations for explaining further embodiments of the present invention.

Even though the polarization-influencing optical element 200 in the examples in FIG. 7 is respectively embodied with the thickness profile described on the basis of FIGS. 3*a-b* (i.e. for converting a constant linear preferred polarization direction into an at least approximately tangential polarization distribution), the invention is not restricted thereto, and so a different thickness profile of the polarization-influencing optical element 200 can also be selected in further embodiments in order to generate a respectively desired polarization distribution.

FIGS. 10*a-b* explain, in a merely exemplary fashion, a further possible thickness profile of the polarization-influencing optical element 200 and the effect thereof. This thickness profile shown in FIG. 10*a* is selected to be precisely inverted to the thickness profile from FIG. 3*b*, as a result of which a mixed tangential/radial output polarization distribution—as indicated in FIG. 10*b*—is generated, rather than the tangential polarization distribution, from a constant linear input polarization distribution (with a polarization direction extending in the y-direction). In further embodiments, the polarization-influencing optical element 200 can be made of either right-hand or left-hand optically active crystalline quartz.

Figure 8:
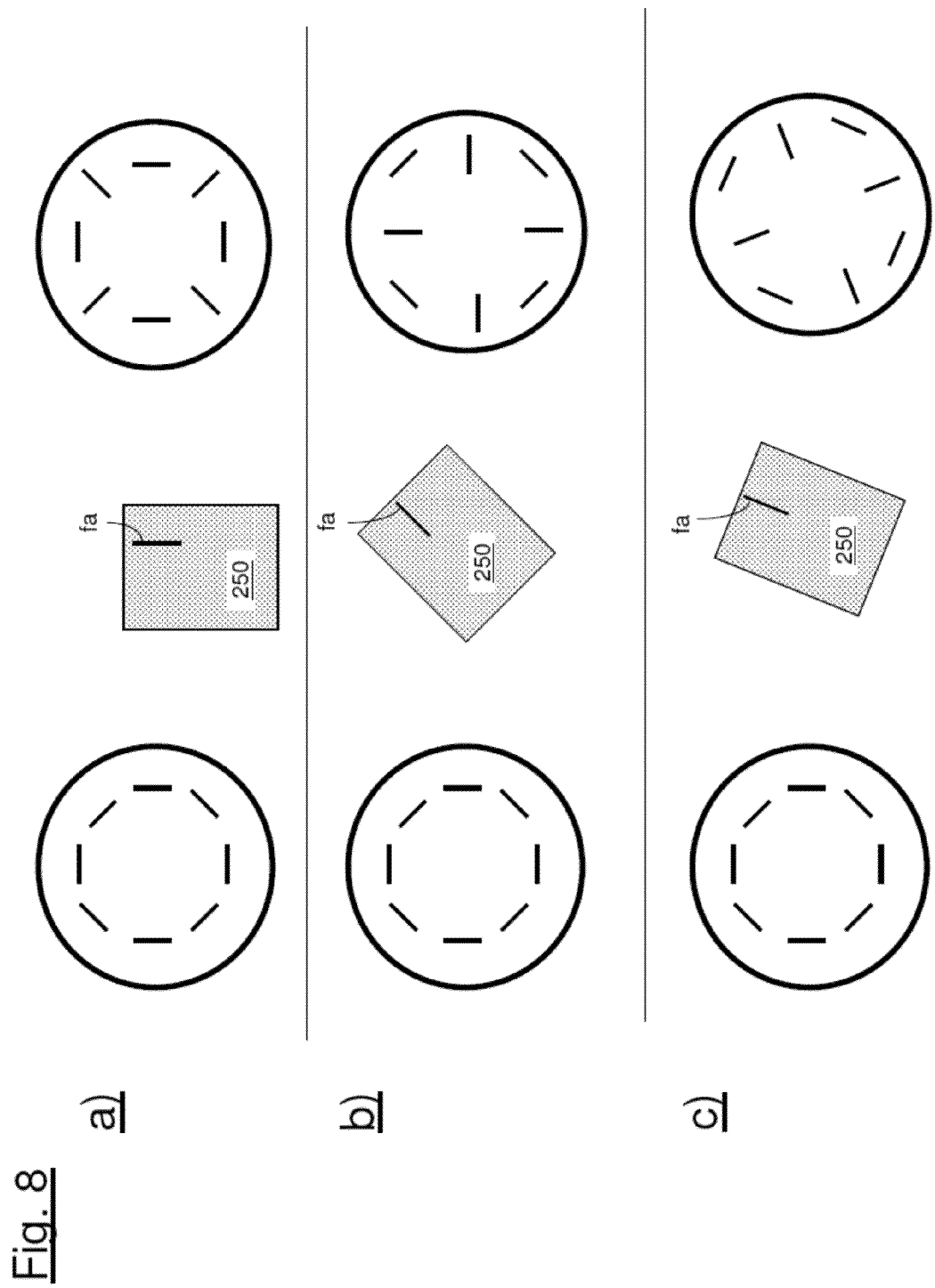
Figure 9:
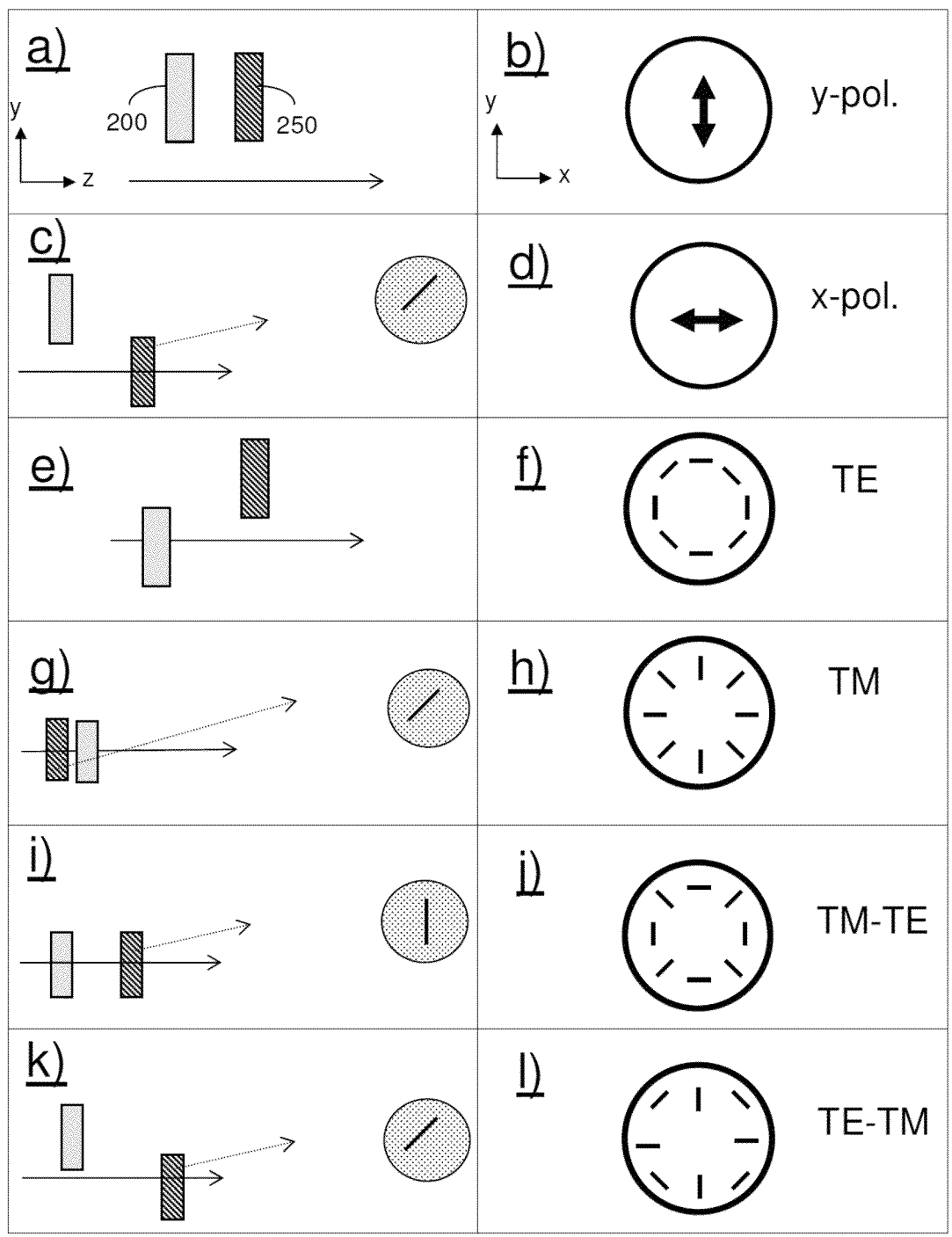
Figure 10:
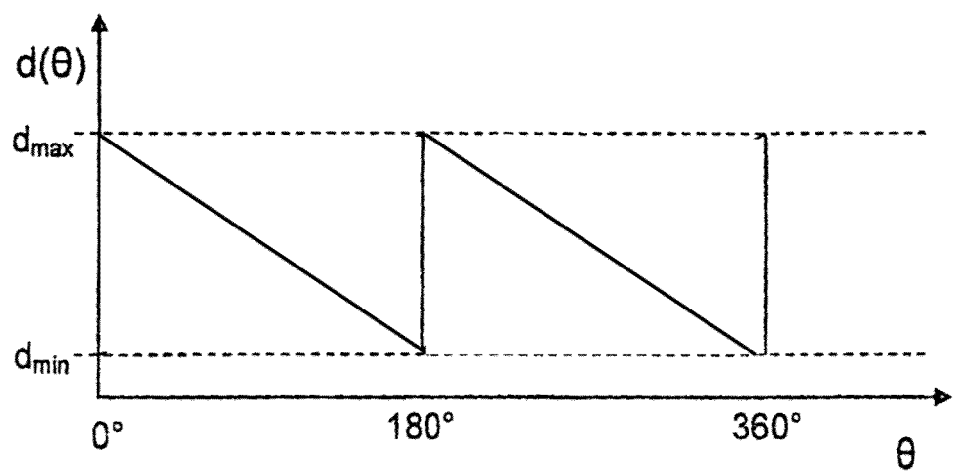
Figure 10:
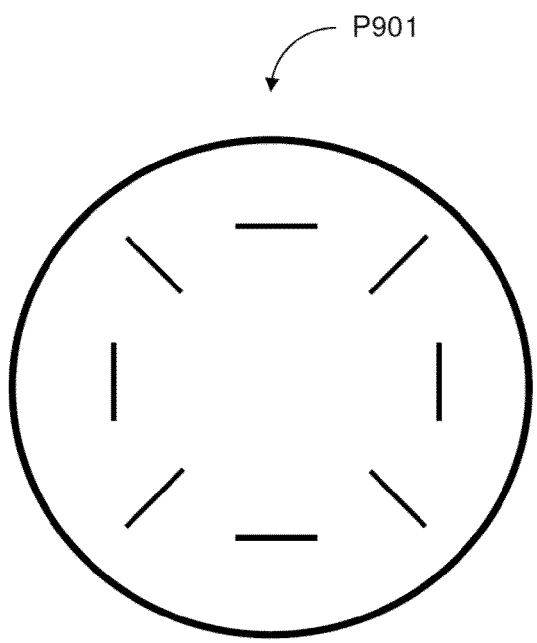

In developments of the invention, it is also possible, as already mentioned above and as will be explained in the following text with reference to FIGS. 8 and 9, merely to use one polarization-influencing optical element 200 (e.g. embodied as described in FIG. 3 or 10) in conjunction with a lambda/2 plate 250, wherein the lambda/2 plate 250 is preferably designed to be rotatable about the optical axis OA of the optical system or about an axis parallel thereto. This renders it possible, for example as shown in FIG. 8*a-c*, to convert a tangential polarization distribution initially generated via the polarization-influencing optical element 200 into different mixed tangential/radial polarization distributions, depending on the orientation of the fast axis of the birefringence in the lambda/2 plate 250. Furthermore, it is also possible in this case, as indicated in FIGS. 9*a-l*, for the polarization-influencing optical element 200 and lambda/2 plate 250 preferably to be moved, selectively and independently of one another, into the optical beam path or out of the optical beam path for the purposes of varying the respectively generated output polarization distribution. Moreover, the sequence of polarization-influencing optical element 200 and lambda/2 plate 250 can also be interchanged (i.e. the lambda/2 plate 250 is arranged upstream of the polarization-influencing optical element 200 in the light-propagation direction)—as indicated in FIG. 9*g*. For the above-described embodiment of the polarization-influencing optical arrangement, FIGS. 9*a-l* show, once again in the form of a table, the respectively obtainable polarization distributions (in FIGS. 9*b, d, f, h, j* and *l*) in the appropriate second column of the table next to the individual different positions within or outside of the optical beam path obtained for the components 200 and 250 contained in the arrangement (FIGS. 9*a, c, e, g, i* and *k*).

Even though the invention has been described on the basis of specific embodiments, numerous variations and alternative embodiments are evident to the person skilled in the art, e.g. through combination and/or exchange of features of individual embodiments. Accordingly, it goes without saying for the person skilled in the art that such variations and alternative embodiments are concomitantly encompassed by the present invention, and the scope of the invention is restricted only within the meaning of the accompanying patent claims and the equivalents thereof.

The invention claimed is:
1. An optical system, comprising:
 a polarization-influencing optical arrangement,
 wherein the polarization-influencing optical arrangement comprises:
  at least one polarization-influencing optical element which consists of an optically active material with an optical crystal axis and has a thickness profile that varies in the direction of this optical crystal axis, the optical system being configured so that during use of the optical system light propagates within the polarization-influencing optical element along the optical crystal axis;
  at least one lambda/2 plate;
  at least one rotator which causes a rotation of the polarization direction of light incident on the rotator about a constant polarization rotation angle, the rotator comprising an element selected from the group consisting of:
   a) an optically active material that has an optical crystal axis extending parallel to an optical axis of the system; and
   b) two lambda/2 plates; and
  an actuator apparatus, by which the at least one lambda/2 plate and the at least one rotator can be moved inde- pendently of one another between a position within the optical beam path and a position outside of the optical beam path.

2. The optical system according to claim 1, wherein the actuator apparatus can furthermore be used to move the polarization-influencing optical element independently of the at least one lambda/2 plate and the rotator between a position within the optical beam path and a position outside of the optical beam path.

3. The optical system according to claim 1, wherein the rotator causes a rotation of the polarization direction of light incident on the rotator about a polarization rotation angle of 90°.

4. The optical system according to claim 1, further comprising an interchange apparatus for replacing the rotator with a rotator with a different polarization rotation angle.

5. The optical system according to claim 1, wherein the rotator is made of the optically active material that has its optical crystal axis extending parallel to the optical axis.

6. The optical system according to claim 1, wherein the at least one lambda/2 plate is configured to be rotatable about the optical axis or about an axis parallel thereto.

7. The optical system according to claim 1, wherein the polarization-influencing optical element is configured to convert a linear polarization distribution, with a constant preferred polarization direction across the light-beam cross section, of a light beam passing through the polarization-influencing optical element into an at least approximately tangential polarization distribution.

8. The optical system according to claim 1, wherein the polarization-influencing optical element is configured to convert a linear polarization distribution, with a constant preferred polarization direction across the light-beam cross section, of a light beam passing through the polarization-influencing optical element into a mixed tangential/radial polarization distribution.

9. The optical system according to claim 1, wherein the polarization-influencing optical element has an element axis and the thickness profile is only dependent on the azimuth angle, wherein the azimuth angle is in relation to a reference axis, which is perpendicular to the element axis and intersects the element axis.

10. The optical system according to claim 1, wherein the optically active material of the polarization-influencing optical element is crystalline quartz.

11. The optical system according to claim 1, wherein the at least one lambda/2 plate, in terms of its position within the optical beam path, is arranged downstream, with respect to the light-propagation direction of the polarization-influencing optical element.

12. The optical system according to claim 1, wherein the at least one lambda/2 plate has at least one first sub-element of optically positive uniaxial crystal material and at least one second sub-element of optically negative uniaxial crystal material.

13. The optical system according to claim 1, wherein the at least one lambda/2 plate is arranged downstream, with respect to the light-propagation direction, of a first pupil plane of the illumination device.

14. The optical system according to claim 1, wherein a system retardation generated in the optical system upstream, with respect to the light-propagation direction, of the at least one lambda/2 plate is at least partly compensated for by a system retardation generated in the optical system downstream, with respect to the light-propagation direction, of the at least one lambda/2 plate.

15. The optical system according to claim 1, wherein the polarization-influencing optical arrangement comprises an arrangement of a plurality of lambda/2 plates.

16. The optical system according to claim 1, wherein the alignment of the fast axis of the birefringence varies in this arrangement of lambda/2 plates.

17. The optical system according to claim 16, wherein, at each pupil point, the fast axis of the birefringence in this arrangement of lambda/2 plates in each case extends perpendicular or parallel to a desired polarization direction at this pupil point.

18. The optical system according to claim 16, wherein the optical system is an optical system of a microlithographic projection exposure apparatus.

19. A projection exposure apparatus, comprising:
an illumination device; and
a projection lens,
wherein the illumination device and/or the projection lens comprise an optical system according to claim 1, and wherein the projection exposure apparatus is a microlithographic projection exposure apparatus.

20. A method for producing microlithographic microstructured components, the method comprising the following steps:
providing a substrate, onto which at least in part a layer of a light-sensitive material has been applied;
providing a mask which has structures to be imaged;
providing a microlithographic projection exposure apparatus according to a projection exposure apparatus; and
projecting at least part of the mask onto a region of the layer with the aid of the projection exposure apparatus,
wherein the projection exposure apparatus comprises an illumination device and a projection lens, and wherein the illumination device and/or the projection lens comprise an optical system according to claim 1.

* * * * *

UNITED STATES PATENT AND TRADEMARK OFFICE
CERTIFICATE OF CORRECTION

PATENT NO.        : 8,891,060 B2
APPLICATION NO.   : 13/860755
DATED             : November 18, 2014
INVENTOR(S)       : Ingo Saenger Page 1 of 1

It is certified that error appears in the above-identified patent and that said Letters Patent is hereby corrected as shown below:

In the Specification

Col. 3, line 26, delete "for the".

Col. 4, line 11, delete "path" and insert -- path. --.

Col. 7, line 21, delete "FIG." and insert -- Figures --.

Col. 12, line 7, delete "FIG." and insert -- Figures --.

Signed and Sealed this
Twenty-fourth Day of March, 2015

Michelle K. Lee
*Director of the United States Patent and Trademark Office*